Figure 1:
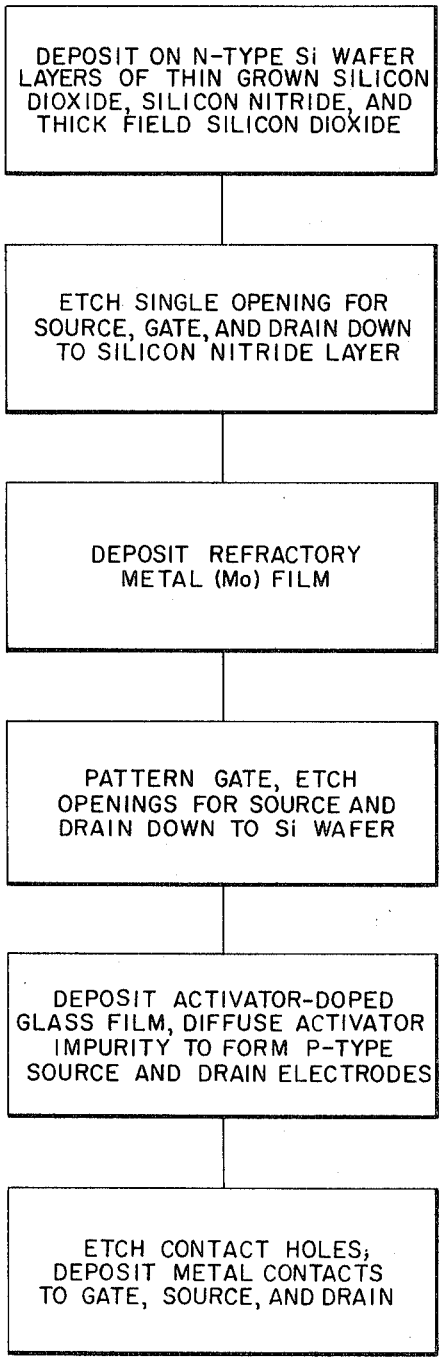
Figure 2:
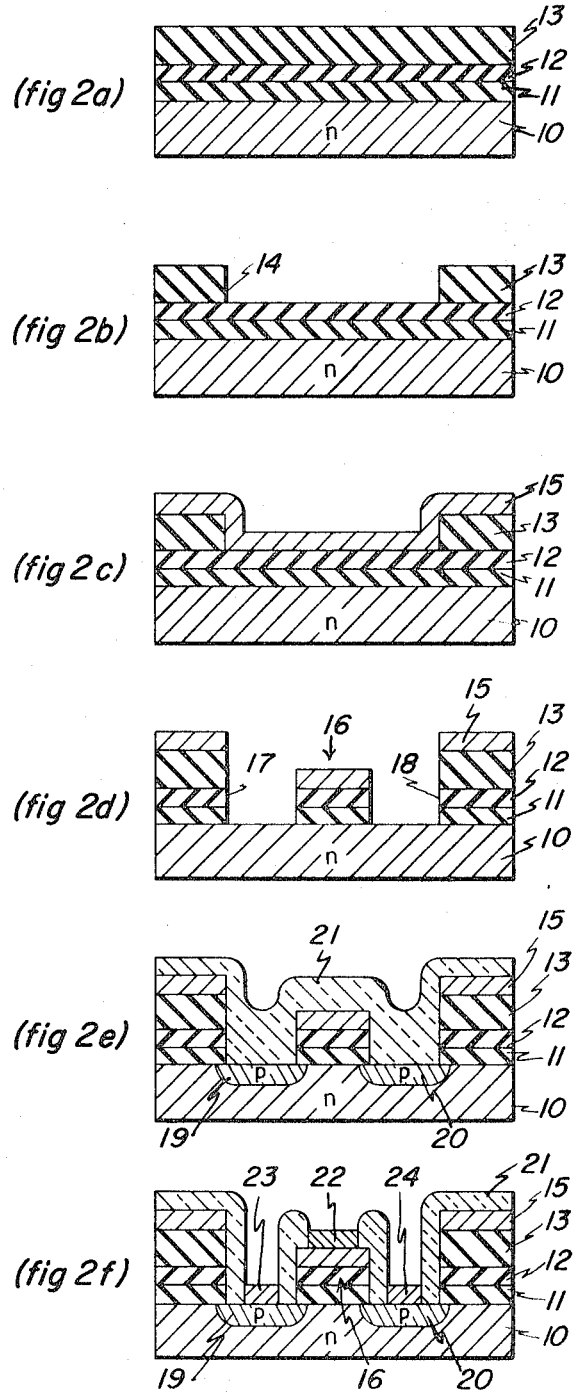
Figure 3:
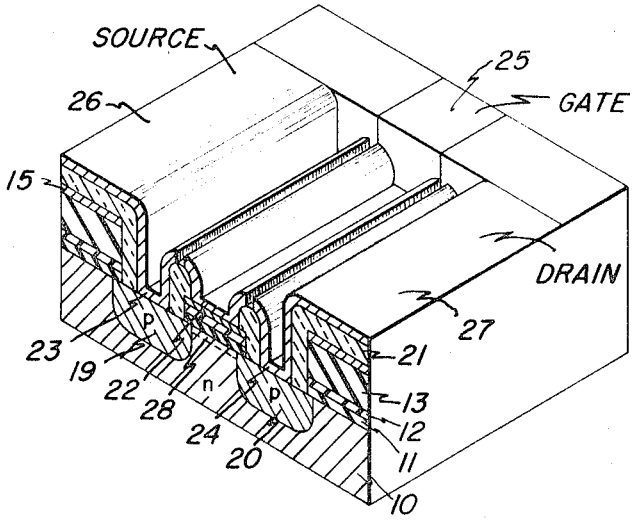

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JUNE 22, 1971

887 O.G. 1045

T887,018
FABRICATION OF INTEGRATED CIRCUIT GATE FIELD EFFECT TRANSISTORS
Gianpiero S. Rodari, Milan, Italy, assignor to General Electric Company
Filed Mar. 17, 1970, Ser. No. 20,301
Int. Cl. H01l *7/44*
U.S. Cl. 148—187
2 Sheets Drawing. 16 Pages Specification

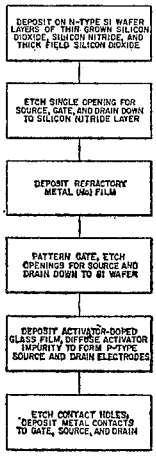

A low cost optimum process for fabricating monolithic integrated circuit insulated gate field effect transistors which utilize a refractory metal diffusion mask. As the first step, there is deposited on the semiconductor substrate a thin layer of gate insulator, preferably a laminate of grown silicon dioxide and silicon nitride, and a thick pyrolytically deposited field oxide. After forming a single opening down to the silicon nitride for source, gate, and drain regions, and depositing a thin film of molybdenum, subsequent processing is completed without removing the initially deposited gate insulator. This includes forming drain and source openings through the refractory metal film and gate insulator layers, depositing an activator impurity-doped glass coating over the entire processed substrate, and diffusing the activator impurity into the substrate using the patterned molybdenum film as a diffusion mask. Contact holes are then made through the glass coating, and contact metallizations are applied.

FABRICATION OF INTEGRATED CIRCUIT GATE FIELD EFFECT TRANSISTORS

Filed March 17, 1970 2 Sheets-Sheet 1

INVENTOR:
GIANPIERO S. RODARI, by Donald R. Campbell
HIS ATTORNEY

FABRICATION OF INTEGRATED CIRCUIT GATE FIELD EFFECT TRANSISTORS

Filed March 17, 1970 2 Sheets-Sheet 2

INVENTOR:
GIANPIERO S. RODARI,
by Francis R. Campbell
HIS ATTORNEY